United States Patent
Schiekofer et al.

(10) Patent No.: US 9,090,991 B2
(45) Date of Patent: Jul. 28, 2015

(54) CONTROLLING AN EPITAXIAL GROWTH PROCESS IN AN EPITAXIAL REACTOR

(75) Inventors: Manfred Schiekofer, Freising (DE); Pietro Foglietti, Altdorf (DE); Robert Maier, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 921 days.

(21) Appl. No.: 13/278,723

(22) Filed: Oct. 21, 2011

(65) Prior Publication Data
US 2012/0035768 A1    Feb. 9, 2012

Related U.S. Application Data

(62) Division of application No. 12/061,474, filed on Apr. 8, 2008.

(30) Foreign Application Priority Data

Apr. 13, 2007    (DE) .......................... 10 2007 017 592

(51) Int. Cl.
| | |
|---|---|
| *C30B 25/10* | (2006.01) |
| *C30B 25/16* | (2006.01) |
| *C30B 23/00* | (2006.01) |
| *C30B 23/06* | (2006.01) |
| *C30B 29/52* | (2006.01) |

(52) U.S. Cl.
CPC .............. *C30B 25/16* (2013.01); *C30B 23/002* (2013.01); *C30B 23/06* (2013.01); *C30B 25/10* (2013.01); *C30B 29/52* (2013.01)

(58) Field of Classification Search
USPC ......................................... 117/200, 201, 202
See application file for complete search history.

(56) References Cited

U.S. PATENT DOCUMENTS

| | | | |
|---|---|---|---|
| 4,096,024 A | 6/1978 | Dusserre et al. | |
| 5,936,716 A * | 8/1999 | Pinsukanjana et al. | ......... 356/72 |
| 6,161,054 A | 12/2000 | Rosenthal et al. | |
| 7,127,358 B2 | 10/2006 | Yue et al. | |
| 7,869,894 B2 | 1/2011 | Stirton et al. | |
| 2001/0052517 A1* | 12/2001 | Nakagawa et al. | ........... 219/502 |
| 2002/0107599 A1* | 8/2002 | Patel et al. | ..................... 700/99 |
| 2004/0098145 A1 | 5/2004 | Zhenduo et al. | |
| 2005/0222781 A1 | 10/2005 | Yue et al. | |

OTHER PUBLICATIONS

G.G. Barna, "APC in the Semiconductor Industry, History and Near Term Prognosis", Advanced Semiconductor Manufacturing Conference and Workshop, 1996, ASMC 96 Proceedings, IEEE/SEMI 1996, S 364-369.

A.E. Gower-Hall et al., "Model-Based Uniformity Control for Epitaxial Silicon Deposition", IEEE Transactions on Semiconductor Manufacturing, vol. 15, No. 3, (2002) Seite 295-309.

* cited by examiner

Primary Examiner — Robert M Kunemund
(74) Attorney, Agent, or Firm — Rose Alyssa Keagy; Frank D. Cimino

(57) ABSTRACT

A system for controlling an epitaxial growth process in an epitaxial reactor. The system includes a processor for setting up a modeled output parameter value as a linear function of the actual output parameter value and a second set of thermocouple offset parameter values. The processor also determines a distance between a target output parameter value and the modeled output parameter value.

3 Claims, 1 Drawing Sheet

CONTROLLING AN EPITAXIAL GROWTH PROCESS IN AN EPITAXIAL REACTOR

CROSS-REFERENCE TO RELATED APPLICATIONS

This application is a divisional application of U.S. patent application Ser. No. 12/061,474, filed Apr. 2, 2008 now U.S. Pat. No. 8,940,093, titled "Method of Controlling an Epitaxial Growth Preocess In An Epitaxial Reactor", which claims the benefit of priority under 35 U.S.C. 119 and 37 C.F.R. 1.55 to the prior-filed foreign application, German Application No. 10 2007 017 592.4, filed Apr. 13, 2007, titled "Method of Controlling An Epitaxial Growth Process In An Epitaxial Reactor", the entirety of both are hereby incorporated by reference.

BACKGROUND OF THE INVENTION

This invention relates to a method of controlling an epitaxial growth process in an epitaxial reactor. More particularly, the invention relates to a closed-loop multivariate controller for a silicon-germanium compound epitaxial growth reactor.

SUMMARY

In a silicon-germanium (SiGe) epitaxial reactor, four essential process parameters—silicon growth rate, silicon germanium growth rate, germanium concentration and dopant concentration—have to be controlled for average and also for uniformity. The main influence on these process parameters is the long term deviation of temperature readings due to the ageing of the thermocouples that are used to measure the reactor temperature. This makes the epitaxial process difficult to control such that the epitaxial structure obtained is not within specification.

It is an object of the present invention to achieve improved process control in an epitaxial reactor.

With the foregoing in mind, the present invention provides a method of controlling an epitaxial growth process in an epitaxial reactor. The method comprises performing a first run of the epitaxial growth process, and controlling the temperature of the epitaxial growth process during the first run by a temperature measuring device. The temperature measuring device determines the temperature based on a first thermocouple offset parameter value. The thermocouple offset parameter value is optimized for a second run by measuring an actual output parameter value of the growth process of the first run, setting up a modeled output parameter value by use of the actual output parameter value and a second thermocouple offset parameter value, determining a distance between a target output parameter value and the modeled output parameter value, and determining the second thermocouple offset parameter value as the value of thermocouple offset parameter which provides the minimum distance between the modeled output parameter value and a target parameter value. A second run of the epitaxial growth process is performed and the temperature of the epitaxial growth process is controlled during the second run by the temperature measuring device using the determined second thermocouple offset parameter value for temperature measurement. The first and second thermocouple offset parameters can also be a set of thermocouple parameter values rather than a single value. Primarily, the method of the present invention is based on the recognition that aging of the thermocouples of a temperature measuring device must be considered carefully during an epitaxial growth process. Accordingly, in a closed loop control mechanism, the relevant thermocouple parameters are continuously and automatically adapted without changing the process parameters. The general process parameters can be fully maintained. Maintaining the process parameters reduces the risk of introducing errors in a well established process. The invention compensates for process drift that is due to thermocouple aging by employing a closed-loop controller that download recalculated thermocouple offsets to the epitaxial reactor before each process run. As a result, process parameters—such as reactor temperature, gas flows, and process time—are not adjusted (only the thermocouple offsets which are caused by thermocouple aging are adjusted). Although the thermocouple parameters for each run are not precisely determined, the method according to the invention provides a very good estimate of the actual values of the thermocouple offsets during the next run. Accordingly, the present invention allows the thermocouple values to be anticipated continuously from a preceding run to a following run of the process and allows the thermocouple offsets to be compensated for, in particular the change of the thermocouple offsets.

Preferably the actual output parameter value is averaged over a plurality of process runs before being used for determining the model output parameter value and can be an exponential weighted moving average (EWMA) of process parameters output from the epitaxial reactor over n process runs in the epitaxial reactor. This means that the analysis model is less sensitive to data noise because it is derived from historical data over all runs. Therefore a more accurate value for the thermocouple offset can be obtained.

The parameters can be silicon growth rate, silicon germanium growth rate, germanium concentration and/or dopant concentration, which depend on temperature. The measurement of the output parameters (Si thickness or growth rate, Ge thickness or growth rate, Ge concentration and dopant concentration) is carried out with X-ray diffraction spectrometry and a 4-point measurement on processed SiGe wafers. The method of the present invention can thus be used to control all of the important process parameters in an epitaxial growth process.

The present invention also provides a controller for controlling process parameters in an epitaxial reactor. The controller comprises a means to determine a second set of thermocouple offset values using an analysis model, which is based on a difference between a target output parameter value and a modeled output parameter value. The modeled output parameter value is determined by use of the actual output parameter value and the second set of thermocouple offset values, such that the second set of thermocouple offset values provides a minimum distance between the modeled output parameter value and the target parameter value.

One thermocouple offset parameter value of the second set of thermocouple offset values can relate to a central region of the reactor and another thermocouple offset value can relate to a peripheral region of the reactor so that the temperature can be measured at both the centre and the edge of the epitaxial reactor.

The present invention provides a data analysis module including an analysis model for modeling an actual parameter of an epitaxial growth process in terms of a temperature measuring device offset and a process run number so as to obtain a solution for the device offset that minimizes a difference between the actual parameter and a target parameter for an epitaxial growth process.

Thus the present invention provides the advantage of a better process control, since offsets in the measurement device are compensated for. Furthermore, process engineering time is significantly reduced since the measurement device offsets are automatically adjusted in a closed-loop manner after each process run. Also, since no further hardware is required to be installed in the epitaxial reactor, additional process costs are minimized.

BRIEF DESCRIPTION OF THE DRAWINGS

Further advantages and characteristics of the invention ensue from the description below of a preferred embodiment and from the accompanying drawings, in which.

DETAILED DESCRIPTION OF THE INVENTION

Figure 1:
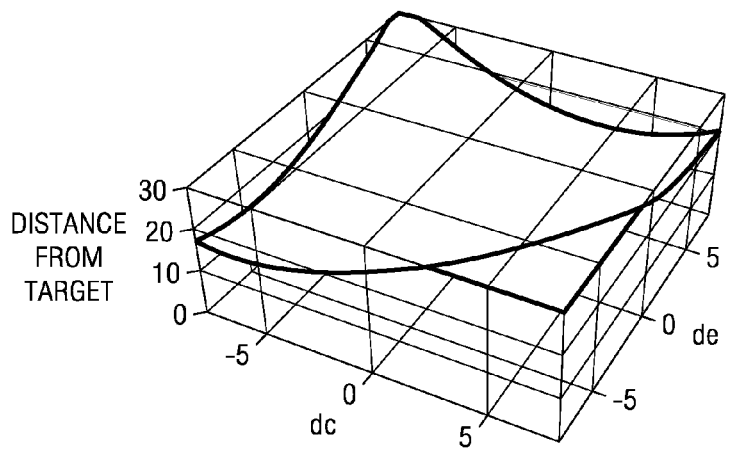
FIG. 1 is a three dimensional plot of the distance of the actual process parameters from the target values against thermocouple offsets.

In an epitaxial reactor employed to grow silicon-germanium layers, four different process parameters must be controlled at the same time in order to get the right compound characteristics. These parameters are the silicon growth rate, the silicon germanium growth rate, the germanium concentration and the dopant concentration. These process parameters have to be controlled for average as well as for uniformity.

Once the epitaxial process set-up has been optimized in terms of temperature, gas flows and time, it has been found that the main process disturbance is mainly due to long term deviation of temperature readings caused by thermocouples aging.

Two thermocouples are employed in an epitaxial reactor—one to measure the temperature in the centre of the epitaxial reactor c and one to measure the temperature at the edge of the reactor e.

The offset parameter values for the thermocouples c and e caused by aging of the thermocouples can be defined by a two-dimensional vector d that has components dc and de.

The four process output parameters—silicon growth rate, silicon germanium growth rate, germanium concentration and dopant concentration can then be defined by a vector $Y_i$. The vector $Y_i$ can be modeled for the epitaxial process run number n in terms of d as follows:

$$Y_i = Y_{0ni} * [u + 1/100(\gamma_i d)] \text{ (with } i = 1,2,3,4) \quad (1)$$

where:

$$u \text{ is a two dimensional vector of components } (1,1) \quad (2)$$

$$\gamma_i \text{ is } 2 \times 2 \text{ array of coefficients } \gamma_i(k,m)(k=c,e\ m=c,e) \quad (3)$$

The $\gamma_i(k,m)$ coefficients are experimentally determined and describe the sensitivity of outputs $Y_i$ to the d changes.

$Y_{0ni}$ is a two dimension vector determined by an exponential weighted average (EWMA) of the historical data over all the n process runs. If the actual value for the output Yi at the run number=n is $Yia_n$, then the $Y_{0ni}$ value for the same run is determined as:

$$Y_{0ni} = kYia_n + (1-k)Y_{0ni} \text{ (with } 0 <= k <= 1) \quad (4)$$

where $Y_{0ni} = Yia_0$ (5)

The EWMA reduces the model sensitivity to data noise.

For each output, a target value $T_i$ to be achieved is determined (the actual value of the process parameter(s) required to produce the desired epitaxial structure), where $T_i$ is a two dimensional vector of components $(T_{ic}, T_{ie})$.

Replacing $Y_i$ with $T_i$ in Equation (1) and inverting it, it is possible to determine the values of the independent variable d.

Four different solutions are found for the vector d, one for each model $Y_i$.

A best compromise solution for the vector d can then be found, which is the minimum of the predicted distance of outputs $Y_i$ from all the four targets $T_i$.

The distance of the output vector $Y_i$ from target vector $T_i$ is:

$$D_i = \text{Sqrt}[(Y_{ic} - T_{ic})^2 + (Y_{ie} - T_{ie})^2] \quad (6)$$

Replacing $Y_i$ with the model equation (1) we obtain:

$$D_i = \text{Sqrt}\{[Y_{0ni} * [1 + 1/100(\gamma_i(c,c)dc + \gamma_i(c,e)de)] - T_{ic}]^2 + (Y_{0ni} * [1 + 1/100(\gamma_i(e,c)dc + \gamma_i(e,e)de)] - T_{ie})^2\} \quad (7)$$

In order to compare the distances among them, equation (7) is normalized to the target, as follows:

$$\underline{D_i} = D_i/|T_i| = D_i/\text{Sqrt}[T_{ic}^2 + T_{ie}^2] \quad (8)$$

The overall normalized distance from all four targets is the sum of all distances $\underline{D_i}$, as follows $$D = \Sigma_i \underline{D_i} \quad (9)$$

It can be seen that $Y_i$ is dependent on the thermocouple offset parameters defined by the vector d. The distance of the vector $Y_i$, representing the actual output values of the process output parameters from the vector $T_i$, representing the target output parameter values of the process parameters (the uniform process parameters needed to grow the required Si—Ge layer structure) is then D.

Figure 2:
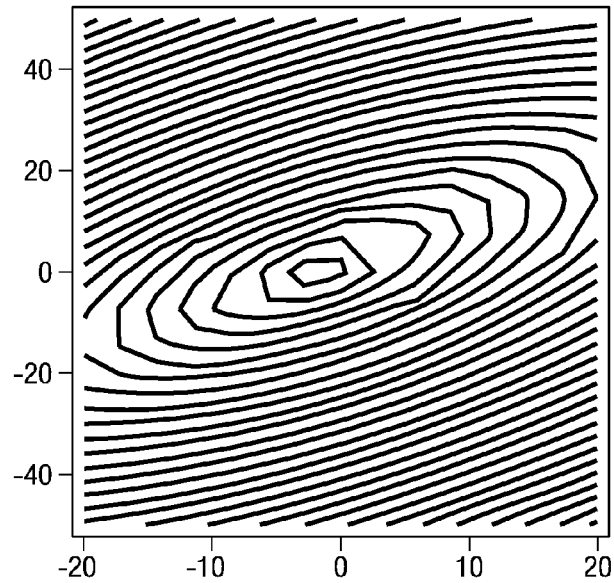
FIG. 2 is a contour plot of the distance of the actual process parameters from the target values against thermocouple offsets.

Since the adopted models $Y_i$ for the process output parameters are linear relationships versus d, the D function has one absolute minimum. This can be seen from FIG. 1 (showing the overall % deviation from the target in 3D) and FIG. 2 (showing the distance of the actual process parameters from the target values); both of which show the distance D against the thermocouple offsets de and dc. Therefore, the thermocouple offset parameter values can be determined from the model. It is then possible to adjust the thermocouples by an amount equal to the calculated offsets to compensate for the actual thermocouple offset parameter values and thus achieve (or approximate) the target output parameter values of the process parameters, based on the above model.

One of these linear models is provided for modeling each of the four process output parameters: the silicon growth rate, the silicon germanium growth rate, the germanium concentration, and the dopant concentration. Using these four models it is possible to relate the values of two independent process variables (the thermocouple offset parameters), the actual process parameter output values and the target output parameter values to achieve the optimum process parameters. The actual output variables are sent from the measurement equipment automatically to the analysis model. Thus the epitaxial reactor is automatically tuned for each process run.

This multivariate analysis for calculating the (variable) thermocouple parameter values in order to achieve the minimum distance from all eight targets is accomplished by a Downhill Simplex algorithm embedded in a closed-loop controller (discussed below). The process model and multivariate optimizer are joined in the closed-loop controller that is able to calculate the process set-up in order to achieve the target process. The process setup data is sent to the epitaxial reactor before each run and the next process is executed with the optimized thermocouple offset parameter values.

Figure 3:
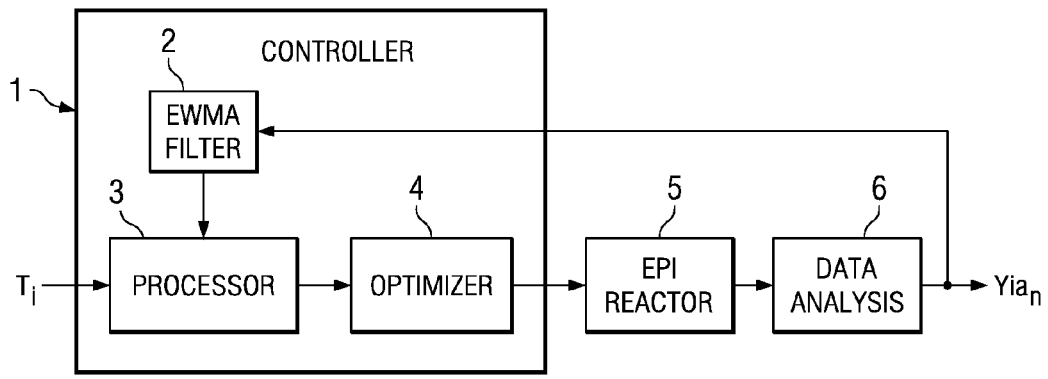
FIG. 3 is a schematic diagram of a system that includes a controller for controlling process parameters in an epitaxial reactor according to the invention.

FIG. 3 shows a controller 1 according to an embodiment of the invention that has an exponential weighted moving average (EWMA) filter 2, a processor 3 and an optimizer 4. The processor 3 is provided with the above-described models $Y_i$. The output of the optimizer 4 is connected to an epitaxial reactor 5. The epitaxial reactor 5 is equipped with an edge thermocouple e for measuring the process temperature at the edge of the reactor 5 and a center thermocouple c for measuring the temperature in the centre of the reactor 5 (the thermocouples c and e are not shown here). The outputs of the thermocouples c and e, inside the reactor 5 are connected to a data analysis module 6, which determines the actual values of the process parameters for a particular growth process according to the measurements obtained by the measuring apparatus.

In operation, as silicon-germanium layers are grown inside the epitaxial reactor 5, the output parameters obtained from the epitaxial reactor 5 by the measuring apparatus are input to the data analysis module 6, which outputs the actual process parameters to the exponential weighted moving average (EWMA) filter 2. The EWMA filter 2 determines the vector $Y_i$ for the four process parameters over a number of process runs n: silicon growth rate, silicon germanium growth rate, germanium concentration, and dopant concentration. The four different solutions for the vector d (the value of d that minimizes the distance D) are then found for each model $Y_i$ by the processor 3. Based on the solutions for the vector d, the thermocouple offset parameter values for the thermocouples c and e are determined. The optimizer 4 then adjusts the setting of the thermocouples c and e inside the epitaxial reactor 5 based on the calculated thermocouple offset parameter values, by an amount that minimizes the difference between the actual process output parameters and the required (target) process output parameters. This means that the thermocouple offset values are optimized for the next process run.

The process model in the processor 3 and the multivariate optimizer 4 are therefore joined in a closed loop controller 1 that calculates the process set-up on a process run-by-process run basis in order to achieve the target process, i.e. in order to achieve the target output parameter values. The process set up data from one process run is sent from the controller 1 to the epitaxial reactor 5 and the next process run will be executed with the optimized values (thermocouple offset parameter values).

Thus the controller of the present invention achieves run-to-run compensation of a change in the thermocouple offset parameter values, which leads to an improved process control, without any further process set-up adjustment.

Although the present invention has been described with reference to a specific embodiment, it is not limited to this embodiment and no doubt further alternatives will occur to the skilled person that lie within the scope of the invention as claimed.

What is claimed is:

1. A system for controlling an epitaxial growth process in an epitaxial reactor, the system comprising:
   an epitaxial reactor for performing a first run of the epitaxial growth process, and controlling a temperature of the epitaxial growth process during the first run by a temperature measuring device that determines the temperature based on a first set of thermocouple offset parameter values; and
   a controller for determining a second set of thermocouple offset parameters for a second run comprising:
      an exponential weighted moving average (EWMA) filter for receiving an actual output parameter value of a growth process of the first run that is output from a data analysis module;
      a processor for setting up a modeled output parameter value as a linear function of the actual output parameter value and a second set of thermocouple offset parameter values, the processor also determining a distance between a target output parameter value and the modeled output parameter value; and
      an optimizer for determining the second set of thermocouple offset parameter values as a set of thermocouple offset values that provides the minimum distance between the modeled output parameter value and the target parameter value;
   wherein the epitaxial reactor also performs a second run of the epitaxial growth process, and controls a temperature of the epitaxial growth process during the second run by a temperature measuring device that measures temperature using the determined second set of thermocouple offset parameter values from the optimizer.

2. The system according to claim 1, wherein a first thermocouple offset value of the second set of thermocouple offset parameter values relates to a central region of the reactor and a second thermocouple offset value relates to a peripheral region of the epitaxial reactor.

3. The system according to claim 1, wherein the actual output parameter value is a silicon growth rate, a silicon germanium growth rate, a germanium concentration, or a dopant concentration.

* * * * *

UNITED STATES PATENT AND TRADEMARK OFFICE
CERTIFICATE OF CORRECTION

| | | |
|---|---|---|
| PATENT NO. | : 9,090,991 B2 | Page 1 of 1 |
| APPLICATION NO. | : 13/278723 | |
| DATED | : July 28, 2015 | |
| INVENTOR(S) | : Manfred Schiekofer, Pietro Foglietti and Robert Maier | |

It is certified that error appears in the above-identified patent and that said Letters Patent is hereby corrected as shown below:

On the title page item (62), lines 1-2, the filing date "Apr. 8, 2008" should read --Apr. 2, 2008--.

Signed and Sealed this
Seventeenth Day of May, 2016

Michelle K. Lee
*Director of the United States Patent and Trademark Office*